(12) United States Patent
Chuang et al.

(10) Patent No.: US 11,839,076 B2
(45) Date of Patent: Dec. 5, 2023

(54) SEMICONDUCTOR STRUCTURE AND METHOD OF FORMING THE SAME

(71) Applicant: Winbond Electronics Corp., Taichung (TW)

(72) Inventors: Che-Fu Chuang, Changhua County (TW); Hsiu-Han Liao, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 225 days.

(21) Appl. No.: 17/472,912

(22) Filed: Sep. 13, 2021

(65) Prior Publication Data
US 2022/0320127 A1    Oct. 6, 2022

(30) Foreign Application Priority Data
Apr. 1, 2021  (TW) .................................. 110112231

(51) Int. Cl.
*H10B 41/47* (2023.01)
*H10B 41/46* (2023.01)
*H10B 41/44* (2023.01)

(52) U.S. Cl.
CPC ............. *H10B 41/47* (2023.02); *H10B 41/46* (2023.02); *H10B 41/44* (2023.02)

(58) Field of Classification Search
CPC .......................................... H10B 41/00–41/70
See application file for complete search history.

(56) References Cited

U.S. PATENT DOCUMENTS

| | | | |
|---|---|---|---|
| 6,340,611 B1 * | 1/2002 | Shimizu ................. | H10B 41/30 257/E27.103 |
| 10,256,246 B2 | 4/2019 | Hayakawa et al. | |
| 2008/0303076 A1 | 12/2008 | Van Schaijk et al. | |
| 2008/0308860 A1 | 12/2008 | Kang et al. | |

* cited by examiner

*Primary Examiner* — Mohammad M Hoque
*Assistant Examiner* — Kevin Quinto
(74) *Attorney, Agent, or Firm* — Muncy, Geissler, Olds & Lowe, P.C.

(57) ABSTRACT

A method of forming a semiconductor structure includes forming first to third sacrificial layers on a substrate including a memory cell area and a peripheral area with a word line area. The second and third sacrificial layers in the word line area are removed to expose the top surface of the first sacrificial layer. The first sacrificial layer in the word line area and the third sacrificial layer in the memory cell area are removed. A word line dielectric layer and a first conductive layer are formed on the substrate in the word line area. The first and second sacrificial layers in the memory cell area are removed. A tunneling dielectric layer is formed on the substrate in the memory cell area. The thickness of the tunneling dielectric layer is smaller than the thickness of the word line dielectric layer.

19 Claims, 19 Drawing Sheets

SEMICONDUCTOR STRUCTURE AND METHOD OF FORMING THE SAME

CROSS REFERENCE TO RELATED APPLICATIONS

This Application claims priority of Taiwan Patent Application No. TW110112231, filed on Apr. 1, 2021, the entirety of which is incorporated by reference herein.

BACKGROUND

Field of the Invention

Some embodiments of the present disclosure relate to a semiconductor structure and a method for forming the same, and, in particular, to a semiconductor structure with a small-sized peripheral area, and a method for forming the same.

Description of the Related Art

In General, memory may be classified into volatile memory and non-volatile memory. Among the non-volatile memories, flash memory has the advantages of low power consumption, low cost, and high reliability, so the development of flash memory has attracted much attention.

The flash chip may be usually divided into a memory cell area and a peripheral area. Currently, because the size of the peripheral area is difficult to reduce, the size of the flash chip is difficult to reduce. Wherein, one of the reasons why it is difficult to reduce the peripheral area is that a charge pump for supplying the voltage of the flash memory cell needs to be provided in the peripheral area. Therefore, when the size of the charge pump is difficult to effectively reduce, the size of the peripheral area is also difficult to reduce.

SUMMARY

In view of the above problems, a withstand voltage degree of the word line structure cell in the word line area of the present disclosure is improved by disposing a dielectric stack with oxide-nitride-oxide (ONO) structure and different dielectric layers with different thicknesses in different area. Wherein the different dielectric layers have a specific thickness relationship with each other. In the case that the entire flash chip needs to reach a specific voltage value, the word line structure cell disclosed in the present disclosure can withstand a larger voltage, so the number of word line structure cells can be reduced. Thus, the area of the peripheral area which is occupied by the word line structure cells can be reduced, thereby reducing the size of the peripheral area, in order to have better features of the semiconductor structure.

According to some embodiments of the present disclosure, a method of forming a semiconductor structure is provided. The method includes forming a first sacrificial layer on a substrate. Wherein, the substrate includes a memory cell area and a peripheral area. Wherein, the peripheral area includes a word line area. A second sacrificial layer is formed on the first sacrificial layer. A third sacrificial layer is formed on the second sacrificial layer. The third sacrificial layer and the second sacrificial layer in the word line area are removed, to expose the top surface of the first sacrificial layer in the word line area. The first sacrificial layer in the word line area and the third sacrificial layer in the memory cell area are removed. A word line dielectric layer is formed on the substrate in the word line area. A first conductive layer is formed on the word line dielectric layer. The second sacrificial layer in the memory cell area is removed. The first sacrificial layer in the memory cell area is removed. A tunneling dielectric layer is formed on the substrate in the memory cell area. The thickness of the tunneling dielectric layer is smaller than the thickness of the word line dielectric layer. A floating gate layer is formed on the tunnel dielectric layer.

According to some embodiments of the present disclosure, a semiconductor structure is provided. The semiconductor structure includes a substrate, a word line dielectric layer, a tunneling dielectric layer, an isolation structure, a first conductive layer, and a floating gate layer. The substrate includes a memory cell area and a peripheral area. Wherein, the peripheral area includes a word line area. The word line dielectric layer is disposed on the substrate in the word line area. The tunneling dielectric layer is disposed on the substrate in the memory cell area. The thickness of the tunneling dielectric layer is smaller than the thickness of the word line dielectric layer. The isolation structure is disposed on the substrate. The top surface of the isolation structure is higher than the top surfaces of the word line dielectric layer and the tunneling dielectric layer. The first conductive layer is disposed on the word line dielectric layer. The floating gate layer is disposed on the tunneling dielectric layer.

DETAILED DESCRIPTION

Figure 1:
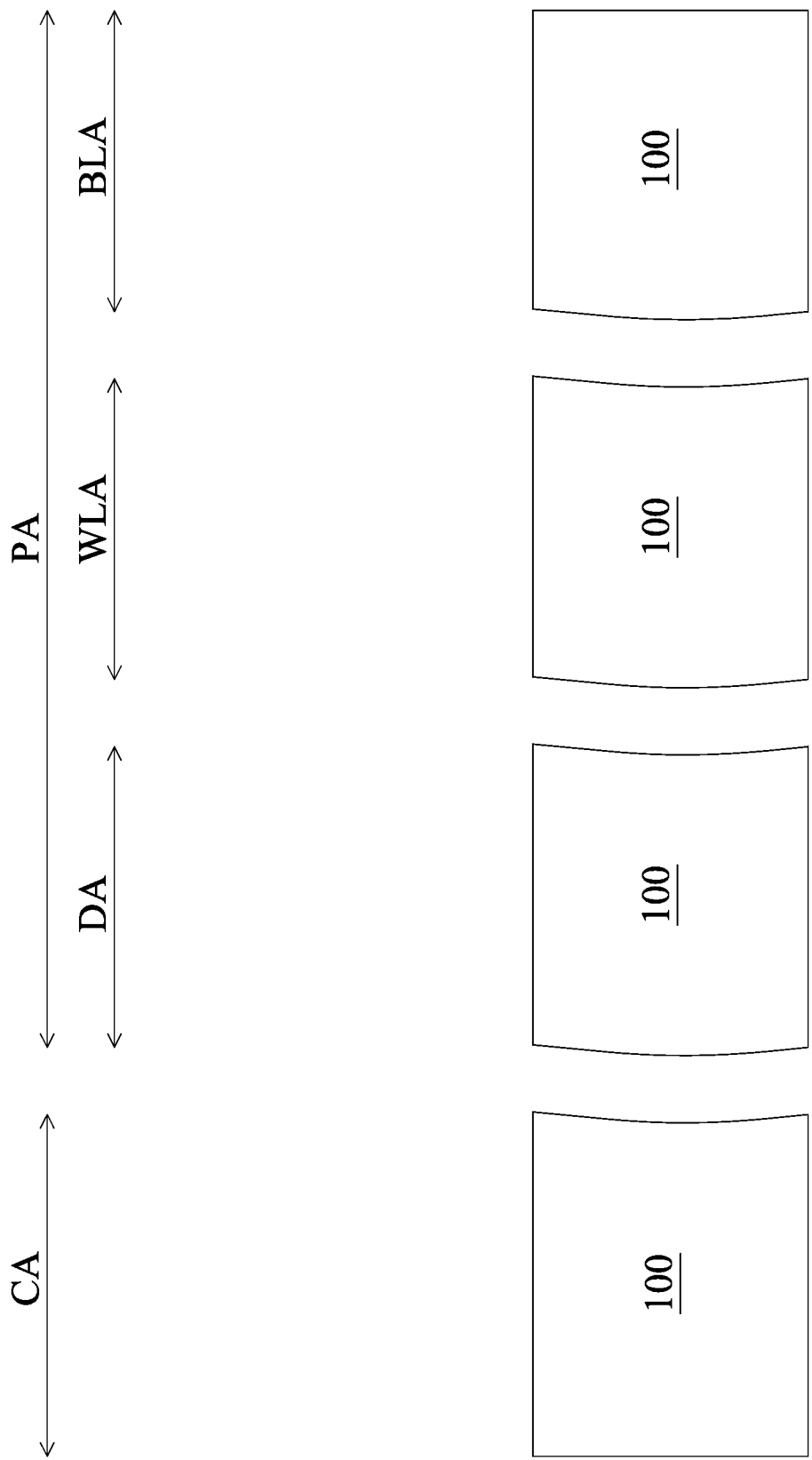
FIGS. 1-19 are schematic cross-sectional views of a semiconductor structure at various stages of formation, according to some embodiments of the present disclosure.

Referring to FIG. 1, a substrate 100 is provided, the substrate 100 includes a memory cell area CA and a peripheral area PA, the peripheral area PA includes the device area DA with the electronic device, the word line area WLA with the word line, and the bit line area BLA with the bit line, the device area DA is disposed between the word line area WLA and the memory cell area CA, the word line area WLA is disposed between the device area DA and the bit line area BLA. However, the present disclosure is not limited thereto.

For ease of description, in the drawings of the present disclosure, each area is drawn in a cell structure. For example, the structure in the word line area WLA may be referred to as a word line structure cell, and the structure in the bit line area BLA may be referred to as a bit line structure cell.

Figure 2:
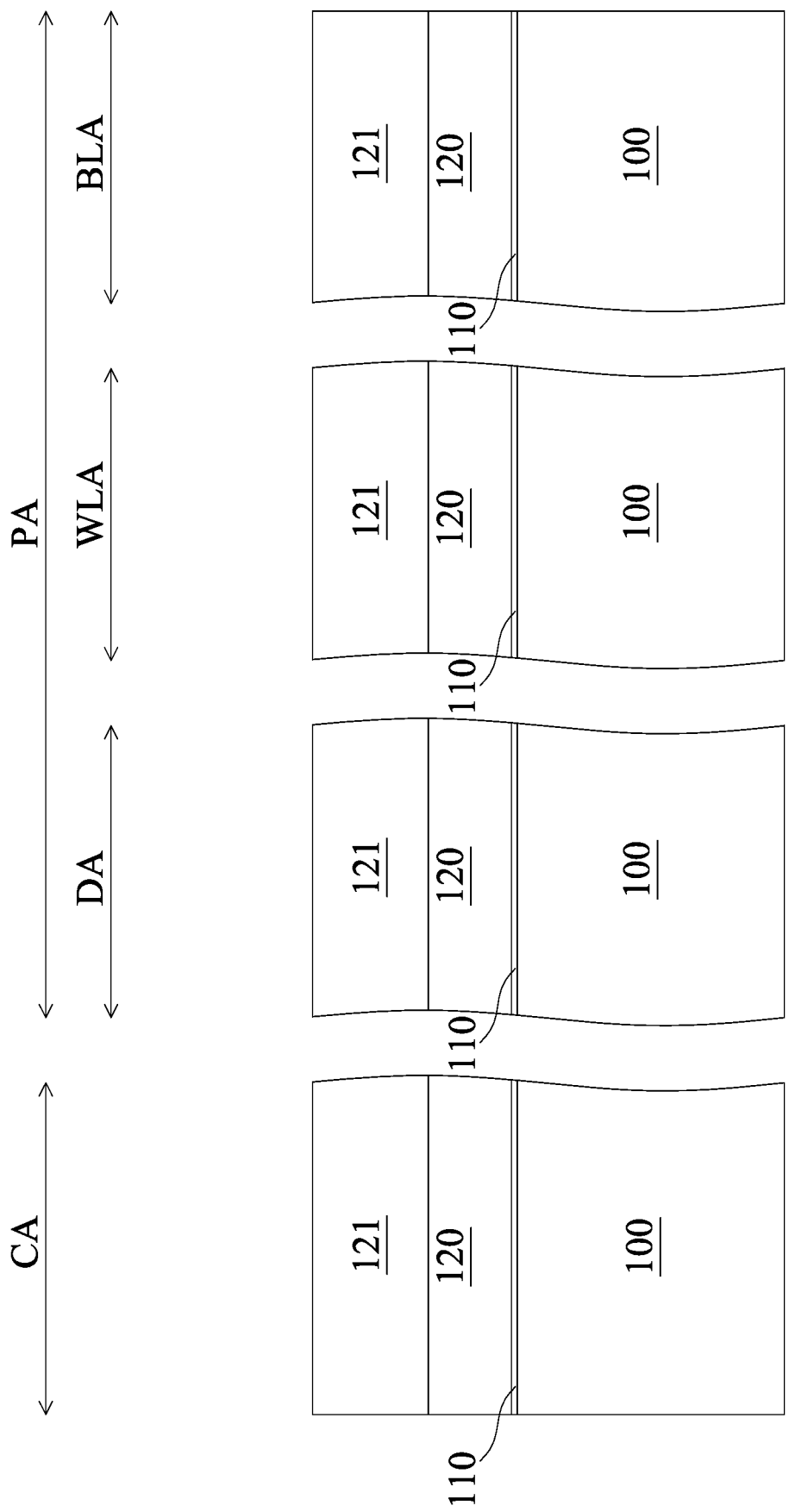

Referring to FIG. 2, a first sacrificial layer 110 is formed on the substrate 100, and a second sacrificial layer 120 is formed on the first sacrificial layer 110, the first sacrificial layer 110 and/or the second sacrificial layer 120 may include oxides, nitrides, oxynitrides, combinations thereof, but the present disclosure is not limited thereto.

As shown in FIG. 2, a first hard mask layer 121 may be further formed on the second sacrificial layer 120, so that the first hard mask layer 121 is used as an etching mask for subsequent etching process, the first hard mask layer 121 may include oxide, nitride, oxynitride, carbide, or a combination thereof.

After forming the first hard mask layer 121 on the second sacrificial layer 120, a photoresist layer may be formed on the first hard mask layer 121. The photoresist layer may be exposed based on the requirement to obtain a patterned photoresist layer. Then, the first hard mask layer 121 is etched by using the aforementioned patterned photoresist layer as an etching mask, to form a patterned first hard mask layer 121.

Figure 3:
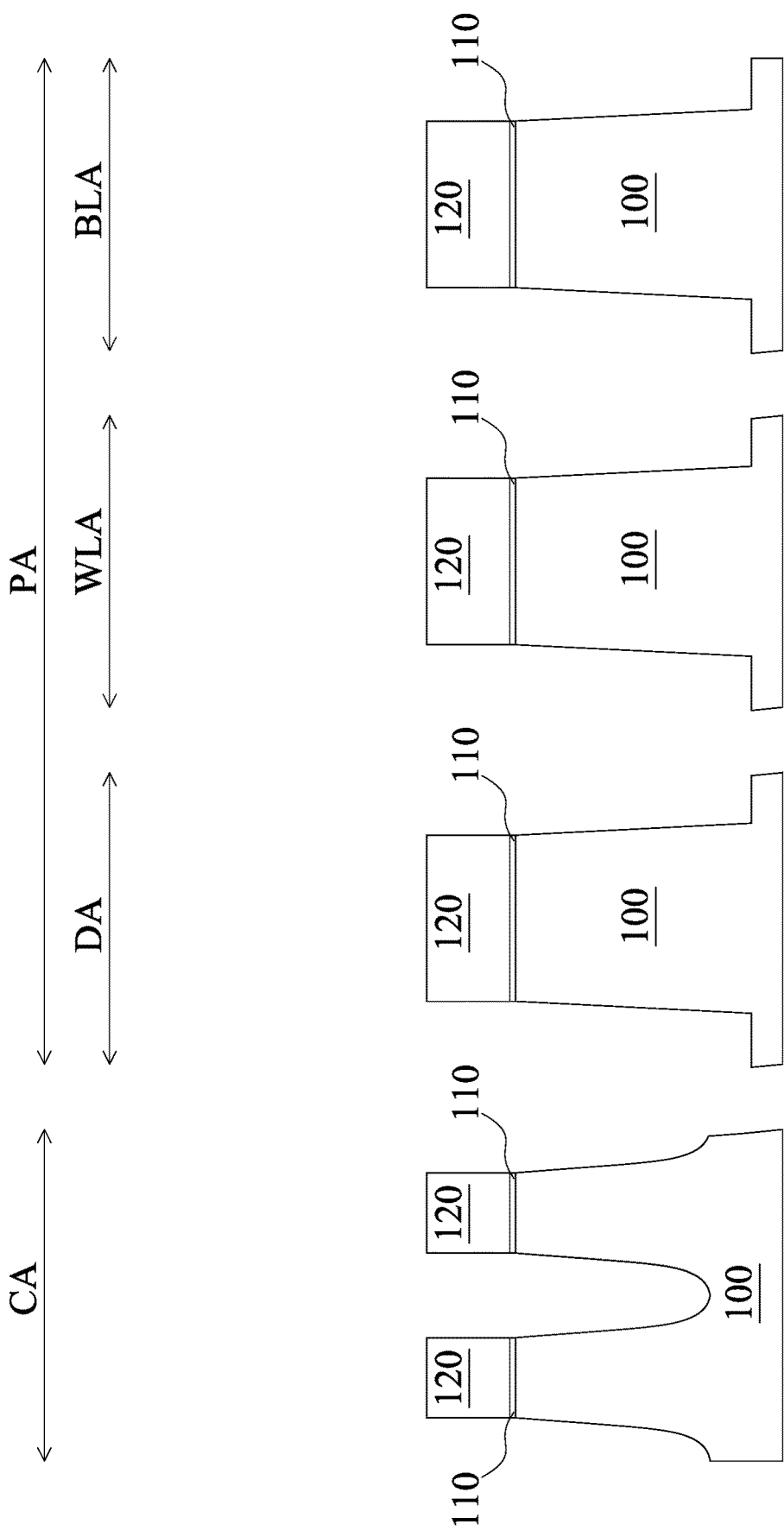

Referring to FIG. 3, the second sacrificial layer 120, the first sacrificial layer 110, and the substrate 100 are etched by using the patterned first hard mask layer 121 as an etching mask, to form trenches located in the substrate 100, the first sacrificial layer 110, and the second sacrificial layer 120. Wherein the trenches may define an active area in the semiconductor structure of the present disclosure, the etched first sacrificial layer 110 and the etched second sacrificial layer 120 are penetrated, but the substrate 100 is not penetrated. It should be understood that the etching depth of the substrate 100 may be adjusted according to requirements. In some embodiments, the trench located in the memory cell area CA may be a U-shaped trench, and the trench located in the peripheral area PA may be a concave trench based on different etching parameters. In some embodiments, the space between the trenches in the memory cell area CA may be smaller than the space between the trenches in the peripheral area PA, so the relative size of the trenches shown in FIG. 3 is merely illustrative and not limited.

Figure 4:
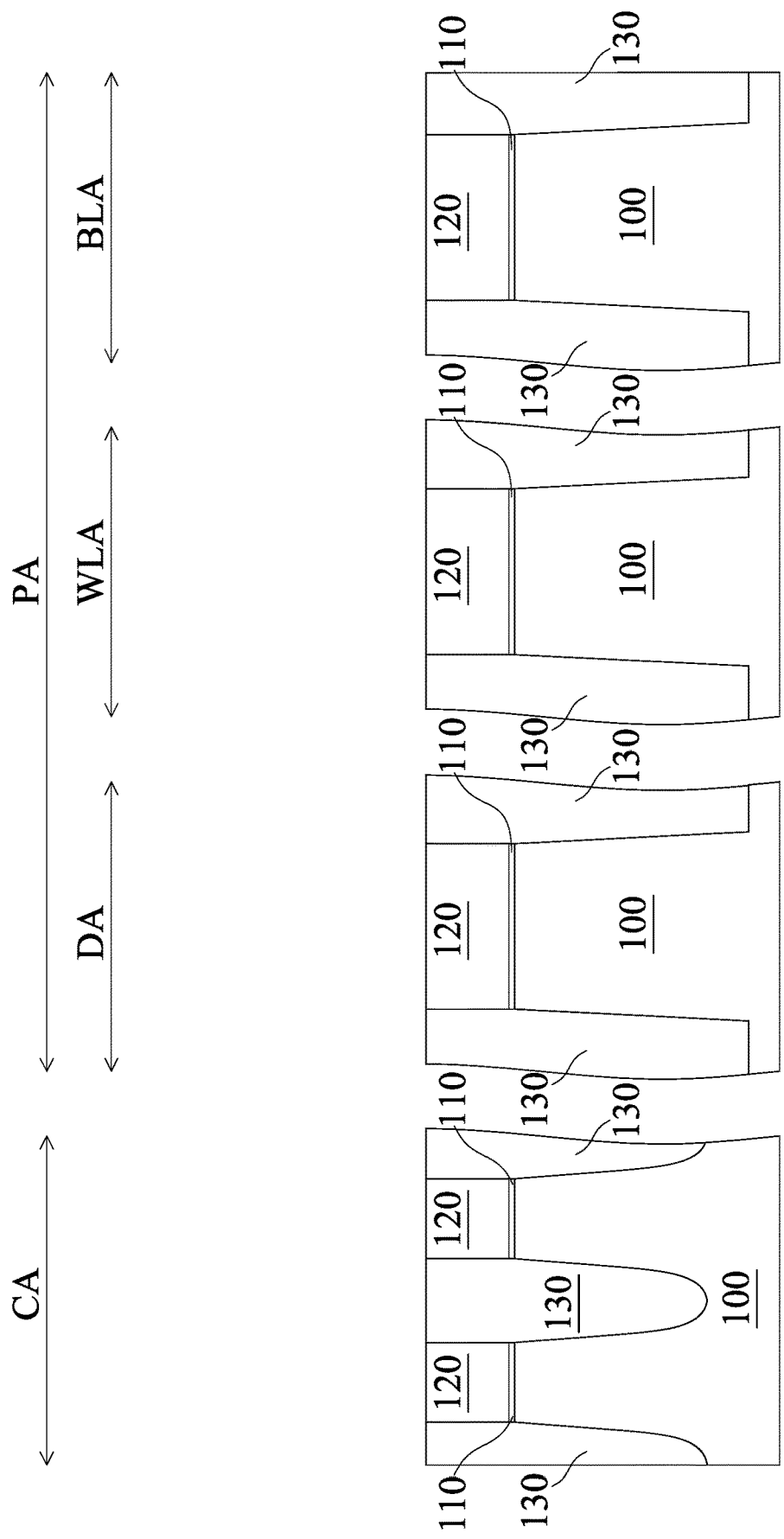

Referring to FIG. 4, an isolation structure 130 is formed on the substrate 100 and in the aforementioned trench before a third sacrificial layer is subsequently formed on the second sacrificial layer 120, so that the isolation structure 130 is located in the substrate 100, the first sacrificial layer 110 and the second sacrificial layer 120.

The step of forming the isolation structure 130 on the substrate 100 may further include: filling an isolation material layer in the aforementioned trench; and performing a planarization process so that the top surface of the isolation material layer and the top surface of the second sacrificial layer 120 is substantially coplanar. Thus, the isolation structure 130 is formed on the substrate 100, the isolation structure 130 may be a shallow trench isolation structure, the isolation structure 130 may include different isolation materials to fill trenches with different aspect ratios, respectively.

Figure 5:
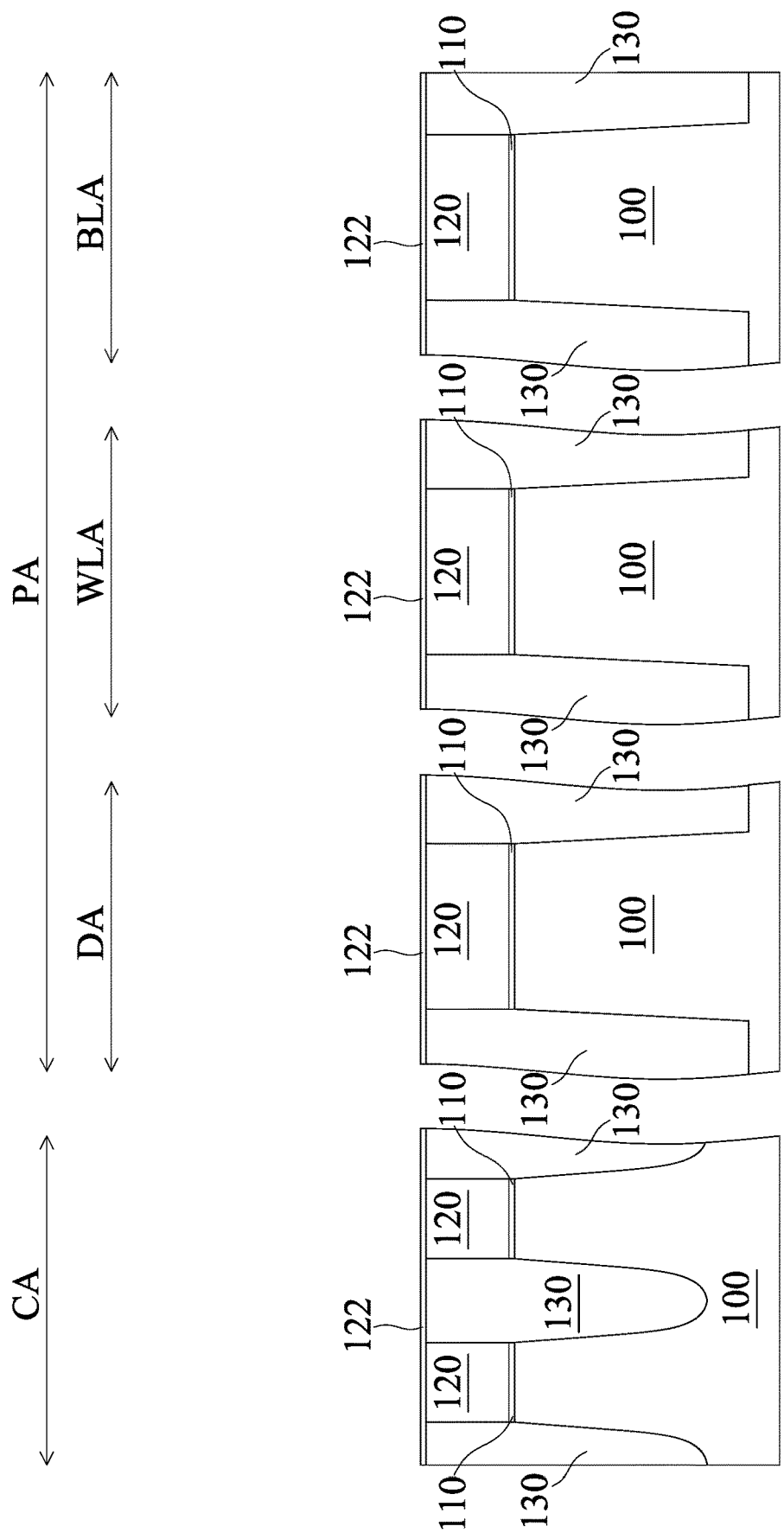

Referring to FIG. 5, a third sacrificial layer 122 is formed on the second sacrificial layer 120. Specifically, the third sacrificial layer 122 is formed on the second sacrificial layer 120 and the isolation structure 130. In some embodiments, the third sacrificial layer 122 and the first sacrificial layer 120 may include the same or different materials, the third sacrificial layer 122 may include an oxide formed by using tetraethoxysilane (TEOS) as a precursor, the thicknesses of the third sacrificial layer 122 and the first sacrificial layer 120 may be substantially the same.

Figure 6:
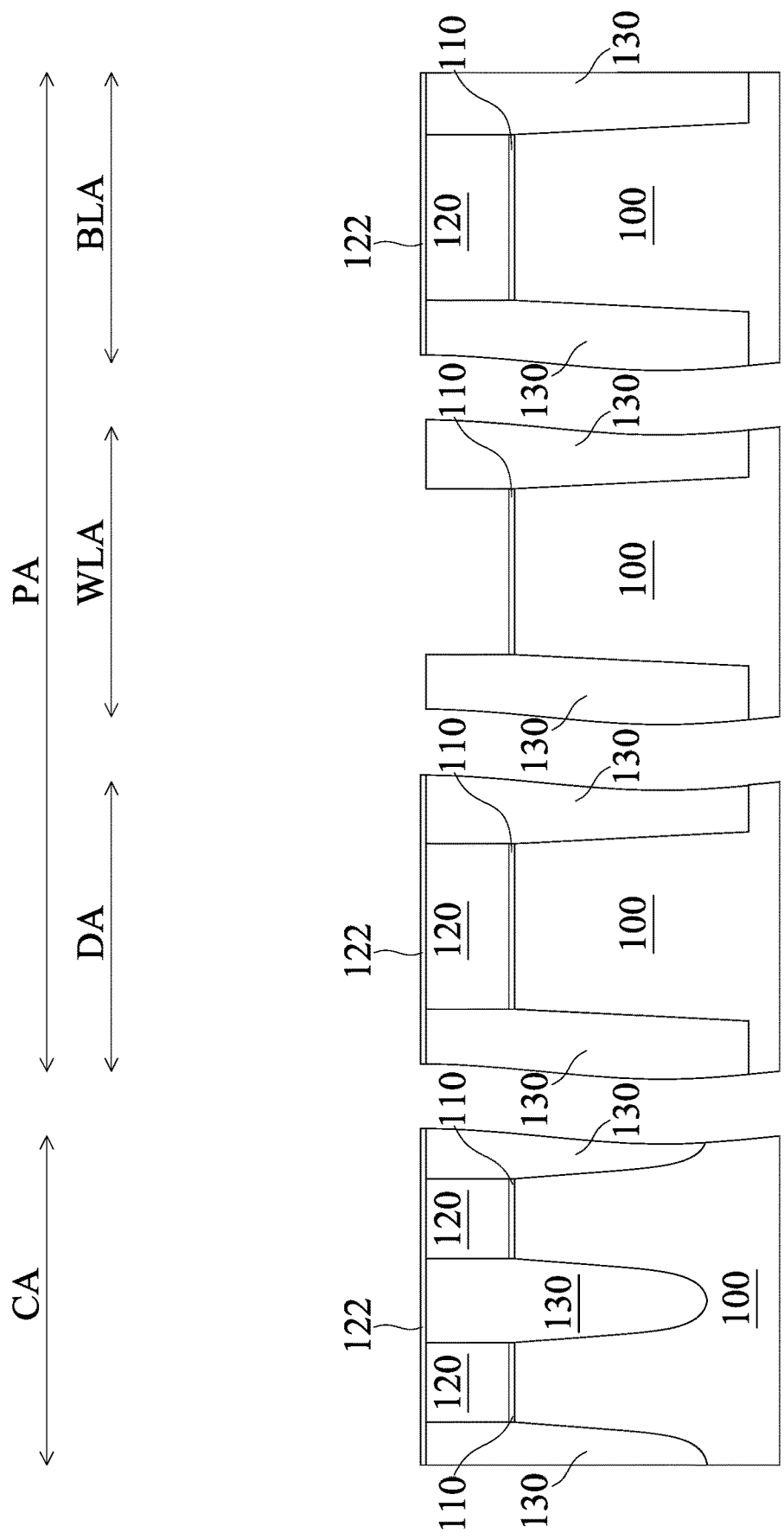

Referring to FIG. 6, the second sacrificial layer 120 and the third sacrificial layer 122 in the word line area WLA are removed to expose the top surface of the first sacrificial layer 110 in the word line area WLA, the second sacrificial layer 120 and the third sacrificial layer 122 in the word line area WLA are removed by lithography and etching processes. For example, a patterned photoresist layer may be formed to cover the memory cell area CA, the device area DA, and the bit line area BLA and expose the word line area WLA. Then, the third sacrificial layer 122 located in the word line area WLA is removed by a wet etching. Similarly, a patterned photoresist layer may be further formed to cover the memory cell area CA, the device area DA, the bit line area BLA, and the isolation structure 130 in the word line area WLA and expose the second sacrificial layer 120 in the word line area WLA. Then, the second sacrificial layer 120 located in the word line area WLA is removed.

Figure 7:
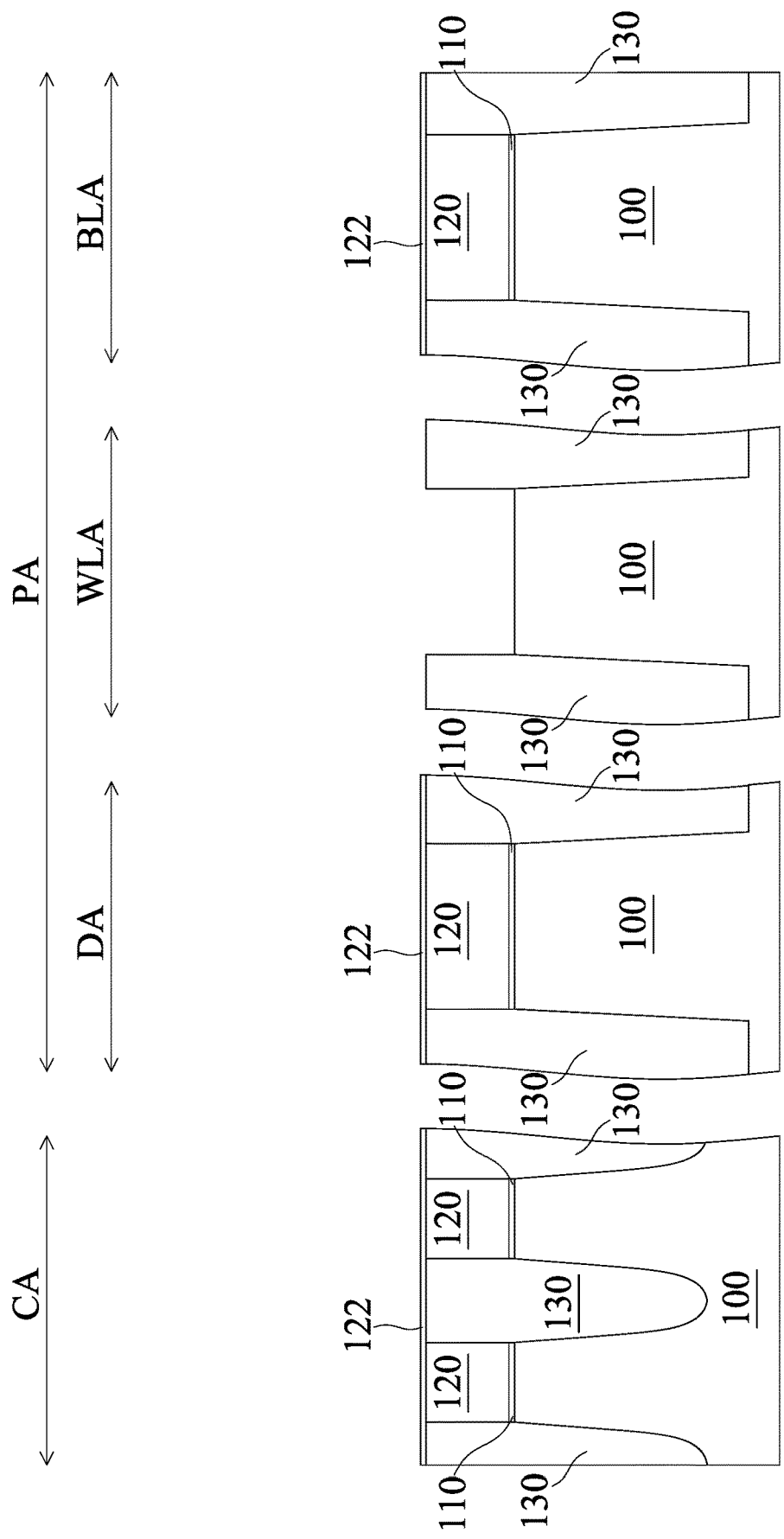

Referring to FIG. 7, the first sacrificial layer 110 in the word line area WLA and the third sacrificial layer 122 in the memory cell area CA, the device area DA, and the bit line area BLA are removed, since the thickness of the first sacrificial layer 110 and the thickness of the third sacrificial layer 122 may be substantially the same, the removal of the first sacrificial layer 110 in the word line area WLA and the removal of the third sacrificial layer 122 in the memory cell area CA, the device area DA, and the bit line area BLA may be performed in the same process. Therefore, the top surface of the substrate 100 in the word line area WLA and the top surfaces of the isolation structure 130 and the second sacrificial layer 120 in the area other than the word line area WLA are exposed at the same time. The process cost may be reduced.

Figure 8:
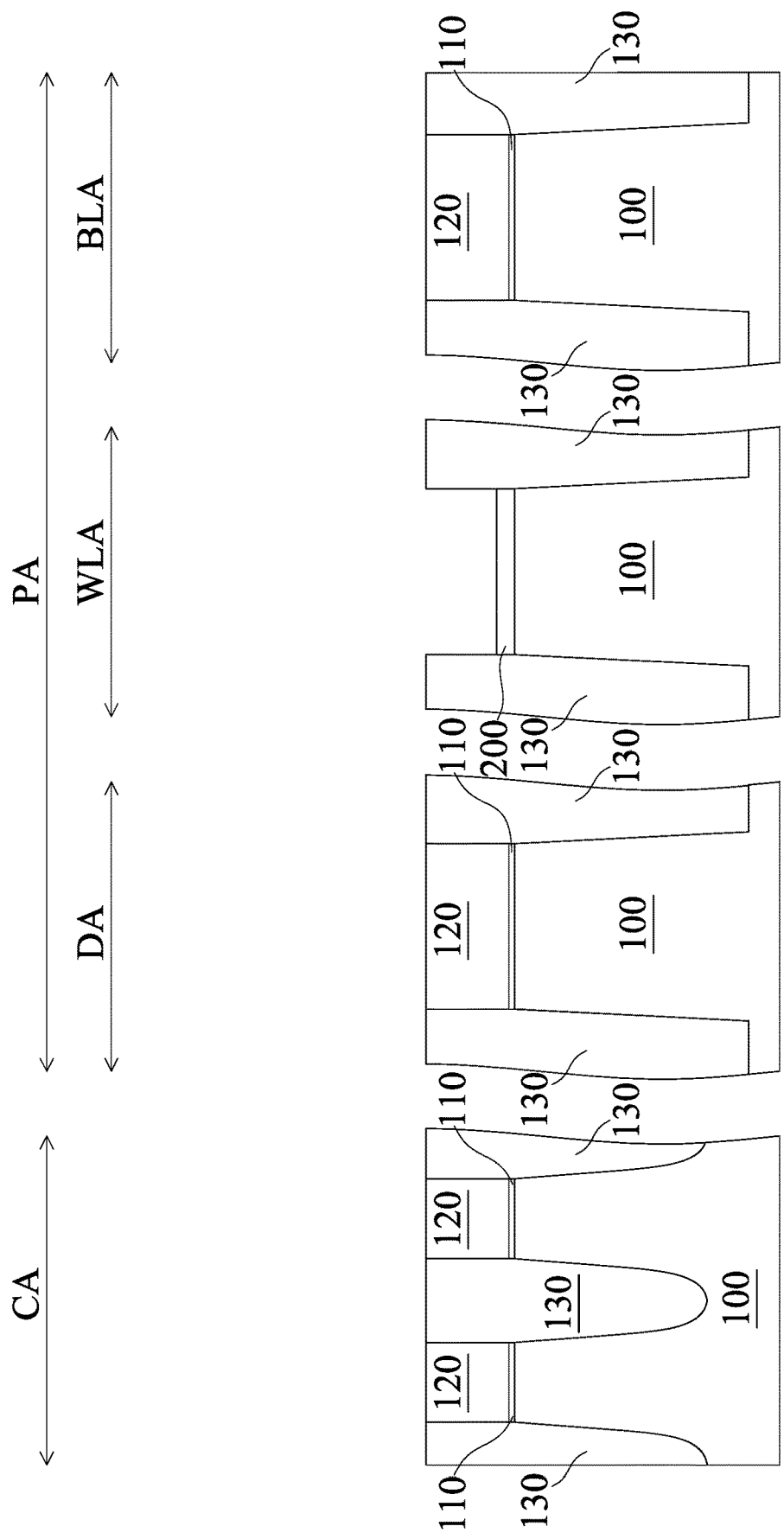

Referring to FIG. 8, a word line dielectric layer 200 is formed on the substrate 100 in the word line area WLA, the thickness of the word line dielectric layer 200 is determined based on the desired withstand voltage of the word line area WLA. For example, the desired withstand voltage of the word line area WLA is higher, the thickness of the word line dielectric layer 200 is thicker, the thickness of the word line dielectric layer 200 may be 10 nm to 20 nm, the word line dielectric layer 200 may include oxide, nitride, oxynitride, a combination thereof, or any other suitable dielectric material, but the present disclosure is not limited thereto, the thickness of the word line dielectric layer 200 may be greater than the thickness of the first sacrificial layer 110.

Figure 9:
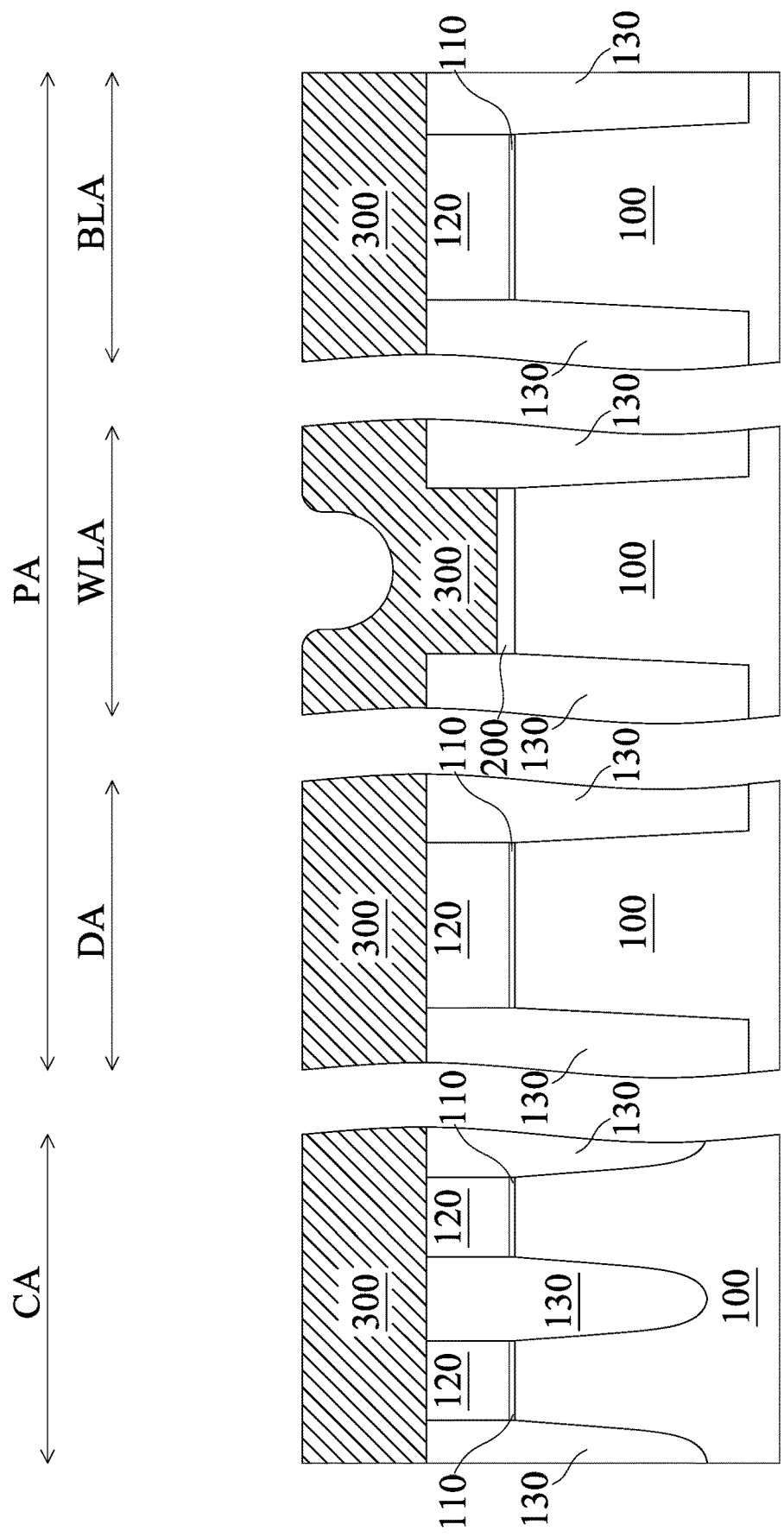

Referring to FIG. 9, a conductive material 300 is formed on the substrate 100. Specifically, the conductive material 300 is formed on the isolation structure 130, the second sacrificial layer 120, and the word line dielectric layer 200, in the word line area WLA, the top surface of the isolation structure 130 is higher than the top surface of the word line dielectric layer 200. That is, the top surface of the isolation structure 130 is farther away from the substrate 100 than the top surface of the word line dielectric layer 200, thereby forming a trench. When the conductive material 300 is formed in the aforementioned trench, a recess may be generated by incomplete filling. Therefore, in order to increase the reliability of the semiconductor structure of the present disclosure, it is necessary to ensure that the bottom surface of the recess is higher than the top surface of the isolation structure 130 to form a conductive layer with good electrical properties. In some embodiments, the conductive material 300 may include polycrystalline silicon, amorphous silicon, metal, metal nitride, conductive metal oxide, a combination thereof, or other suitable materials, but the present disclosure is not limited thereto.

Figure 10:
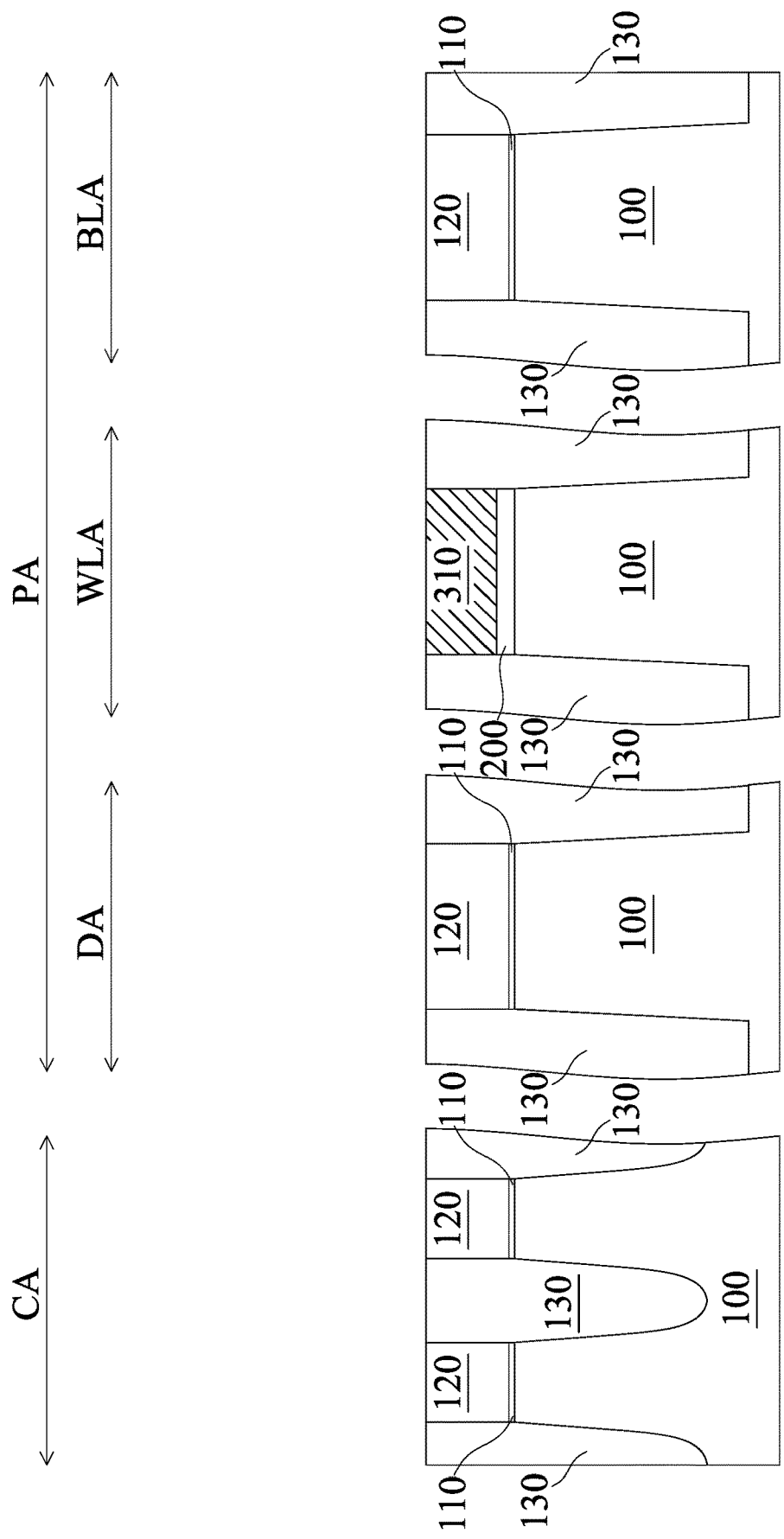

Referring to FIG. 10, a planarization process is performed to remove the conductive material 300 in the memory cell area CA, the device area DA, and the bit line area BLA, so that the top surface of the conductive material 300 and the top surface of the isolation structure 130 are substantially coplanar in the word line area WLA. Thus, a first conductive layer 310 is formed on the word line dielectric layer 200 in the word line area WLA.

Figure 11:
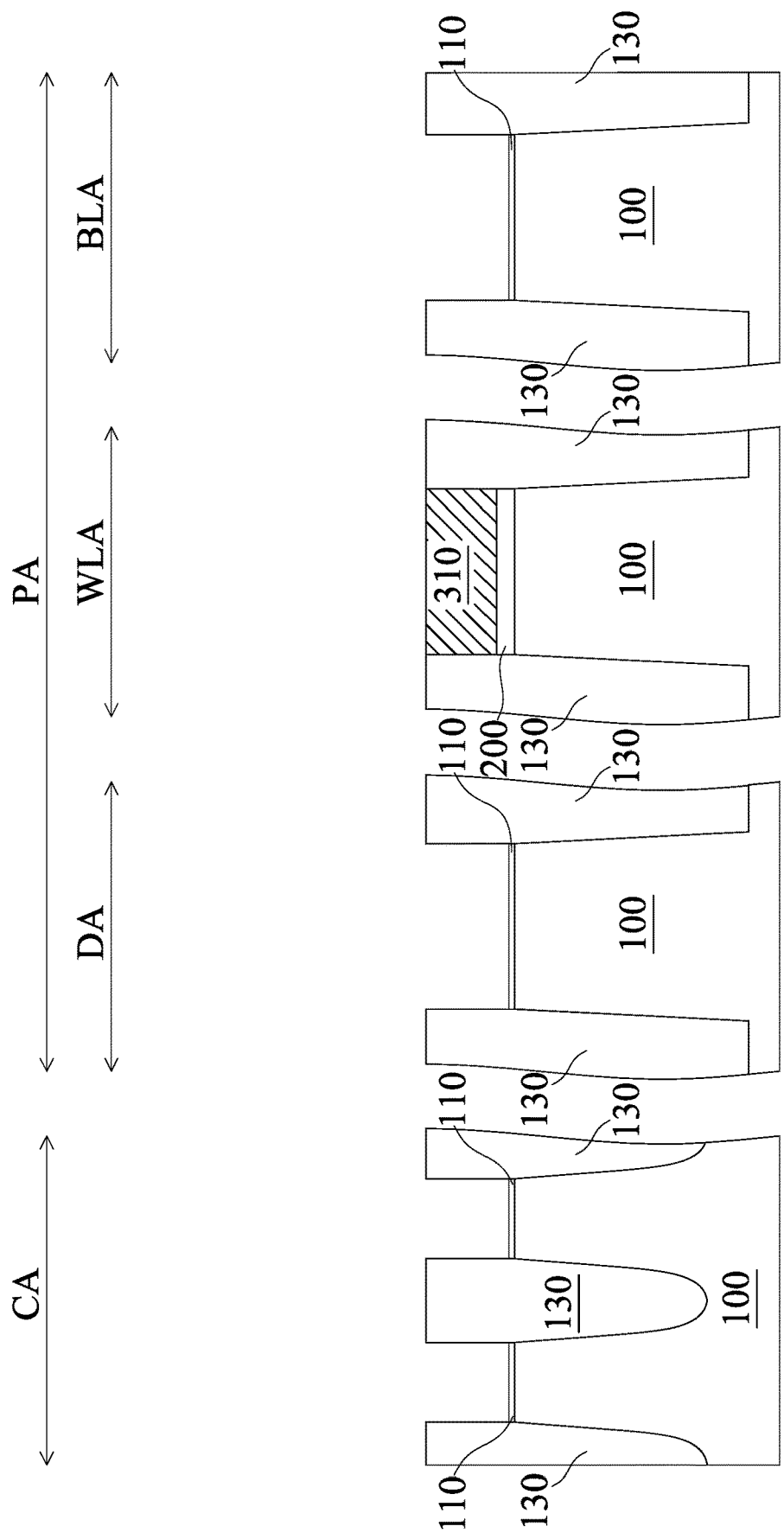

Referring to FIG. 11, the second sacrificial layer 120 in the memory cell area CA is removed to expose the first sacrificial layer 110 in the memory cell area CA, the step of removing the second sacrificial layer 120 in the memory cell area CA may further include removing the second sacrificial layer 120 in the device area DA and the bit line area BLA. That is, the step of removing the second sacrificial layer 120 in the memory cell area CA and the step of removing the second sacrificial layer 120 in the device area DA and the bit line area BLA may be performed in the same process, the removal is performed by an etching process, the process of removing the second sacrificial layer 120 in the memory cell area CA may be the same as or different from the process of removing the second sacrificial layer 120 in the word line area WLA, in detail, a patterned photoresist layer may be formed to cover the word line area WLA and expose the memory cell area CA, the device area DA, and the bit line area BLA. Then, the second sacrificial layer 120 in the memory cell area CA, the device area DA, and the bit line area BLA is removed to expose the first sacrificial layer 110 in the memory cell area CA, the device area DA, and the bit line area BLA.

Figure 12:
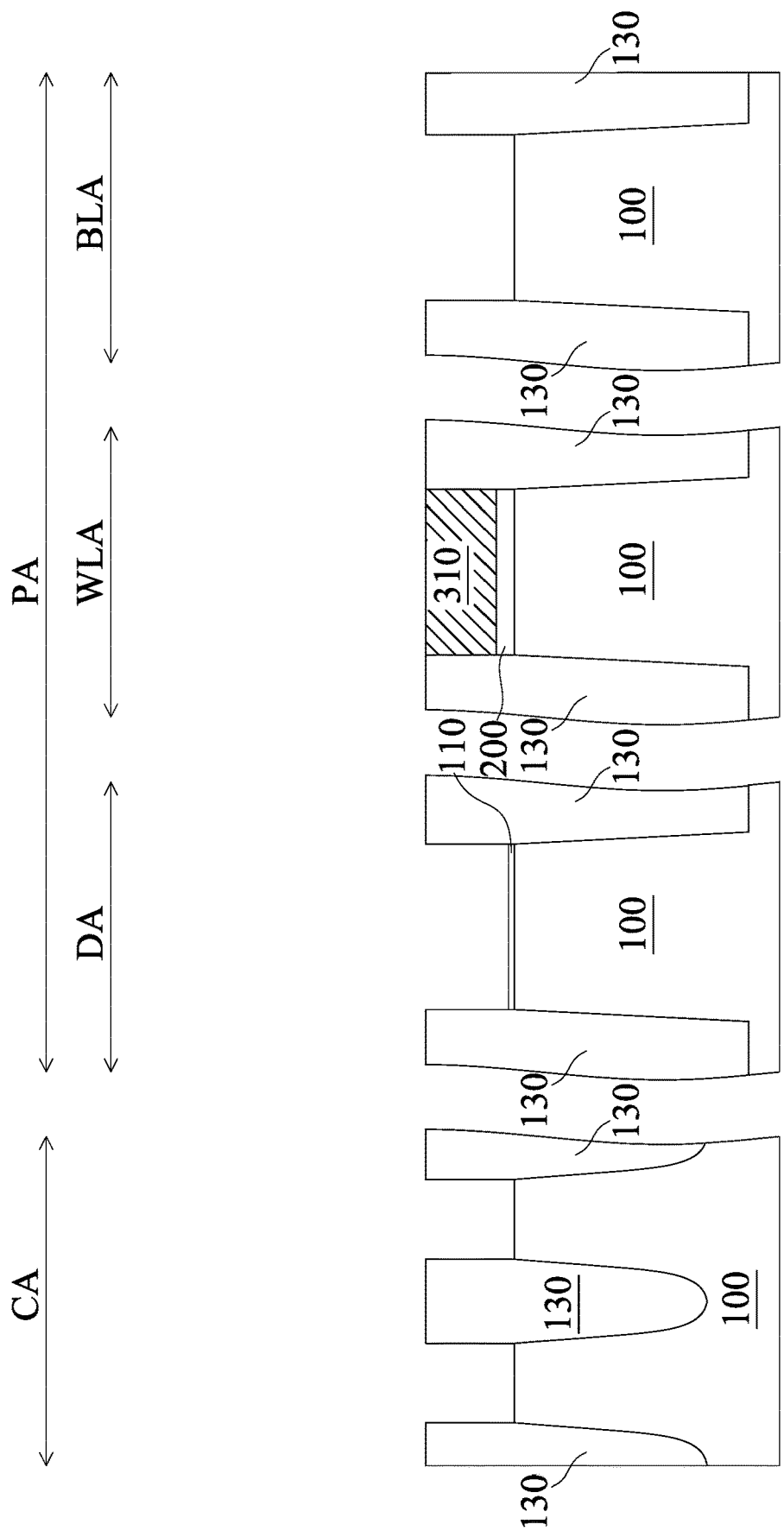

Referring to FIG. 12, the first sacrificial layer 110 in the memory cell area CA is removed to expose the top surface of the substrate 100 in the memory cell area CA, the step of removing the first sacrificial layer 110 in the memory cell area CA may further include removing the first sacrificial layer 110 in the bit line area BLA. In other words, the step of removing the first sacrificial layer 110 in the memory cell area CA and the step of removing the first sacrificial layer 110 in the bit line area BLA may be performed in the same process, in detail, a patterned photoresist layer may be formed to cover the word line area WLA and the device area DA and expose the memory cell area CA and the bit line area BLA. Then, the first sacrificial layer 110 in the memory cell area CA and the bit line area BLA is removed to expose the substrate 100 in the memory cell area CA and the bit line area BLA.

Figure 13:
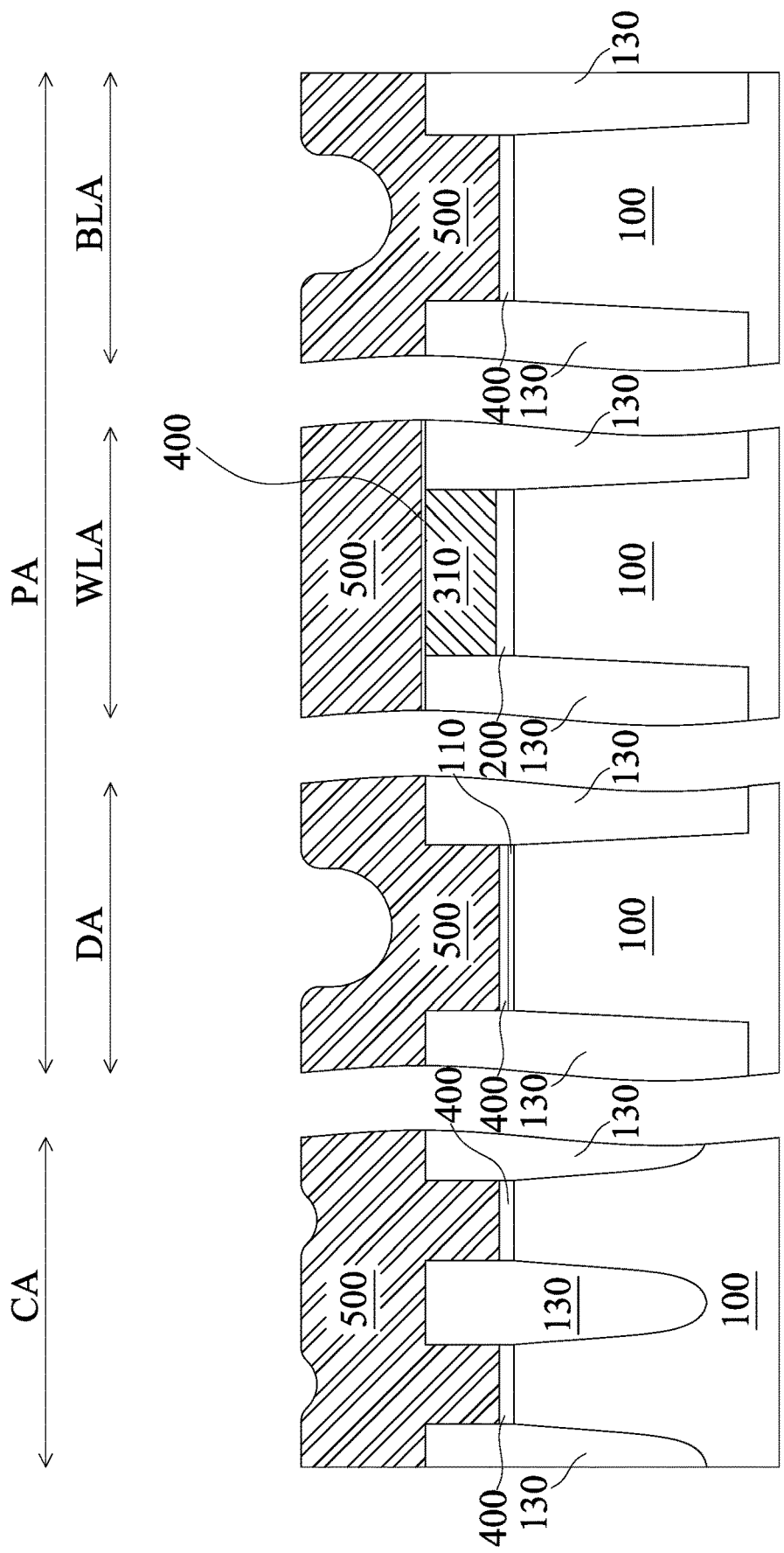

Referring to FIG. 13, a tunneling dielectric layer 400 is formed on the substrate 100 in the memory cell area CA. In some embodiments, the tunneling dielectric layer 400 may be formed on the substrate 100 in the memory cell area CA and the peripheral area PA. Specifically, the tunneling dielectric layer 400 may be formed on the substrate 100 in the memory cell area CA, the first sacrificial layer 110 in the device area DA, the isolation structure 130 and the first conductive layer 310 in the word line area WLA, and the substrate 100 in the bit line area BLA. That is, the tunneling dielectric layer 400 may extend into the bit line area BLA, the thickness of the tunneling dielectric layer 400 is smaller than the thickness of the word line dielectric layer 200, the thickness of the tunneling dielectric layer 400 may be 8 nm to 12 nm, the thickness ratio of the word line dielectric layer 200 to the tunneling dielectric layer 400 is 1.25 to 1.67, the above-mentioned process can be used to make the thickness of the dielectric layer in different regions of the semiconductor structure of the present disclosure be different. For example, the tunneling dielectric layer 400 in the memory cell region CA has a relatively thinner thickness to rapidly response, and the word line dielectric layer 200 in the word line area WLA has a relatively thicker thickness to withstanding high voltage.

Next, a conductive material 500 is formed on the substrate 100. Specifically, the conductive material 500 is formed on the isolation structure 130 and the tunneling dielectric layer 400 in the memory cell area CA and the peripheral area PA, in the memory cell area CA, the top surface of the isolation structure 130 is higher than the top surface of the tunneling dielectric layer 400. That is, the top surface of the isolation structure 130 is farther away from the substrate 100 than the top surface of the tunneling dielectric layer 400, thereby forming a trench. When the conductive material 500 is formed in the aforementioned trench, a recess may be generated by incomplete filling. Therefore, in order to increase the reliability of the semiconductor structure of the present disclosure, it is necessary to ensure that the bottom surface of the recess is higher than the top surface of the isolation structure 130 to form a conductive layer with good electrical properties, the reliability of the conductive layer in the device area DA and the bit line area BLA is ensured as well, the conductive material 500 may be the same as or different from the conductive material 300, the conductive material 500 may include polycrystalline silicon, amorphous silicon, metal, metal nitride, conductive metal oxide, a combination thereof, or other suitable materials, but the present disclosure is not limited thereto.

Figure 14:
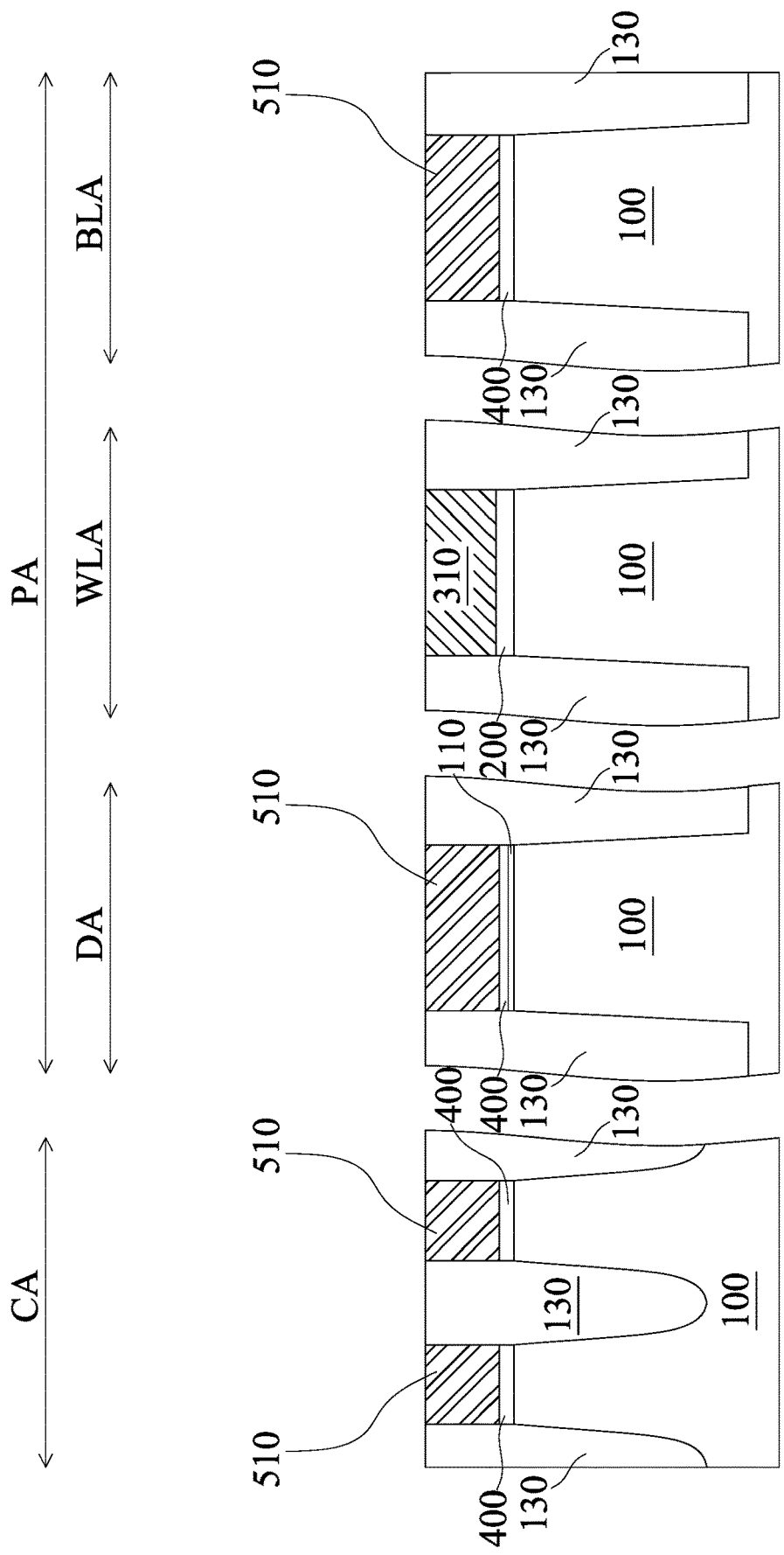

Referring to FIG. 14, a planarization process is performed so that the top surface of the conductive material 500 in the memory cell area CA and the top surface of the isolation structure 130 are substantially coplanar. Thus, a floating gate layer 510 is formed on the tunneling dielectric layer 400 in the memory cell area CA, performing the aforementioned planarization process further includes removing the conductive material 500 and the tunneling dielectric layer 400 in the word line area WLA to expose the top surface of the first conductive layer 310 in the word line area WLA.

Figure 15:
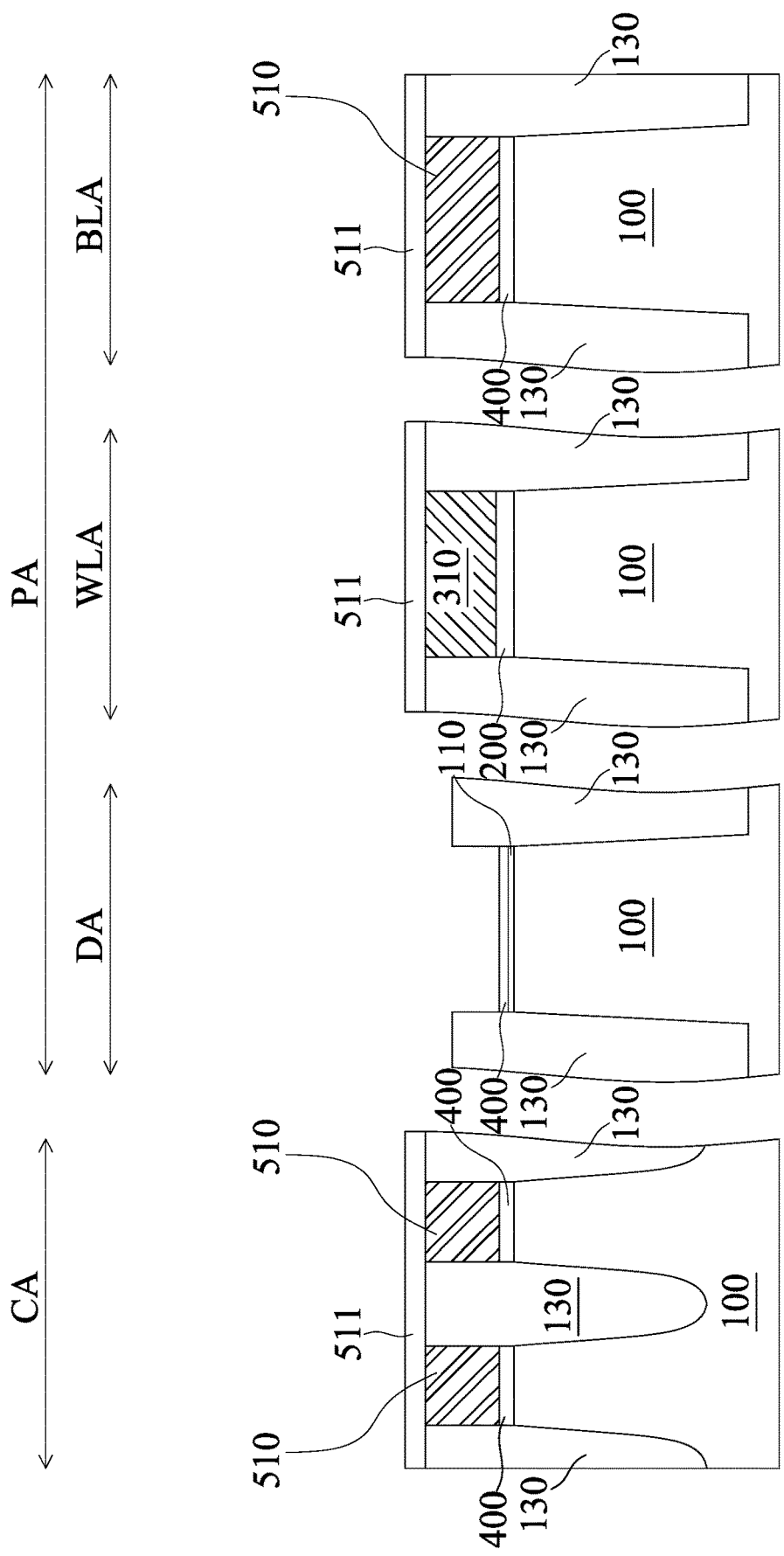

Referring to FIG. 15, the second hard mask layer 511 is formed in the memory cell area CA, the word line area WLA, and the bit line area BLA. Specifically, the second hard mask layer 511 is formed on the floating gate layer 510 in the memory cell area CA, the first conductive layer 310 in the word line area WLA, and the floating gate layer 510 in the bit line area BLA to expose the device area DA, the second hard mask layer 511 and the first hard mask layer 121 may be the same or different, the second hard mask layer 511 may include oxide, nitride, oxynitride, carbide, or a combination thereof. In some embodiments, the second hard mask layer 511 may include an oxide formed by using tetraethoxysilane as a precursor and silicon nitride. The oxide formed by using tetraethoxysilane as a precursor is closer to the substrate 100 than the silicon nitride.

Then, the floating gate layer 510 in the device area DA and a portion of the isolation structure 130 in the device area are removed by using the second hard mask 511 as an etching mask, the top surface of the removed isolation structure 130 in the device area DA is higher than the top surface of the tunneling dielectric layer 400.

Figure 16:
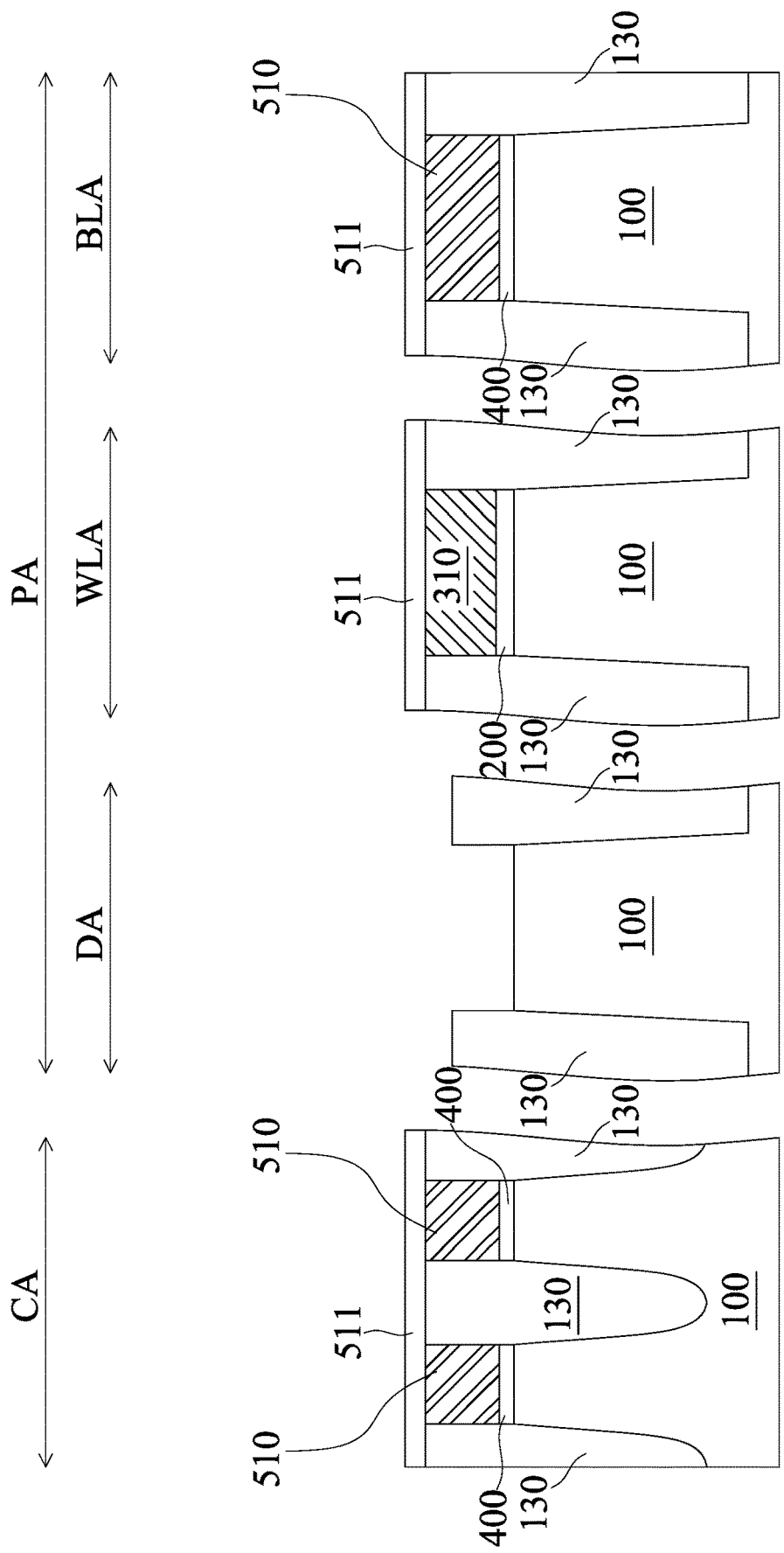

Referring to FIG. 16, the tunneling dielectric layer 400 and the first sacrificial layer 110 in the device area DA is removed by using the second hard mask 511 as an etching mask, to expose the substrate 100 in the device area DA.

Figure 17:
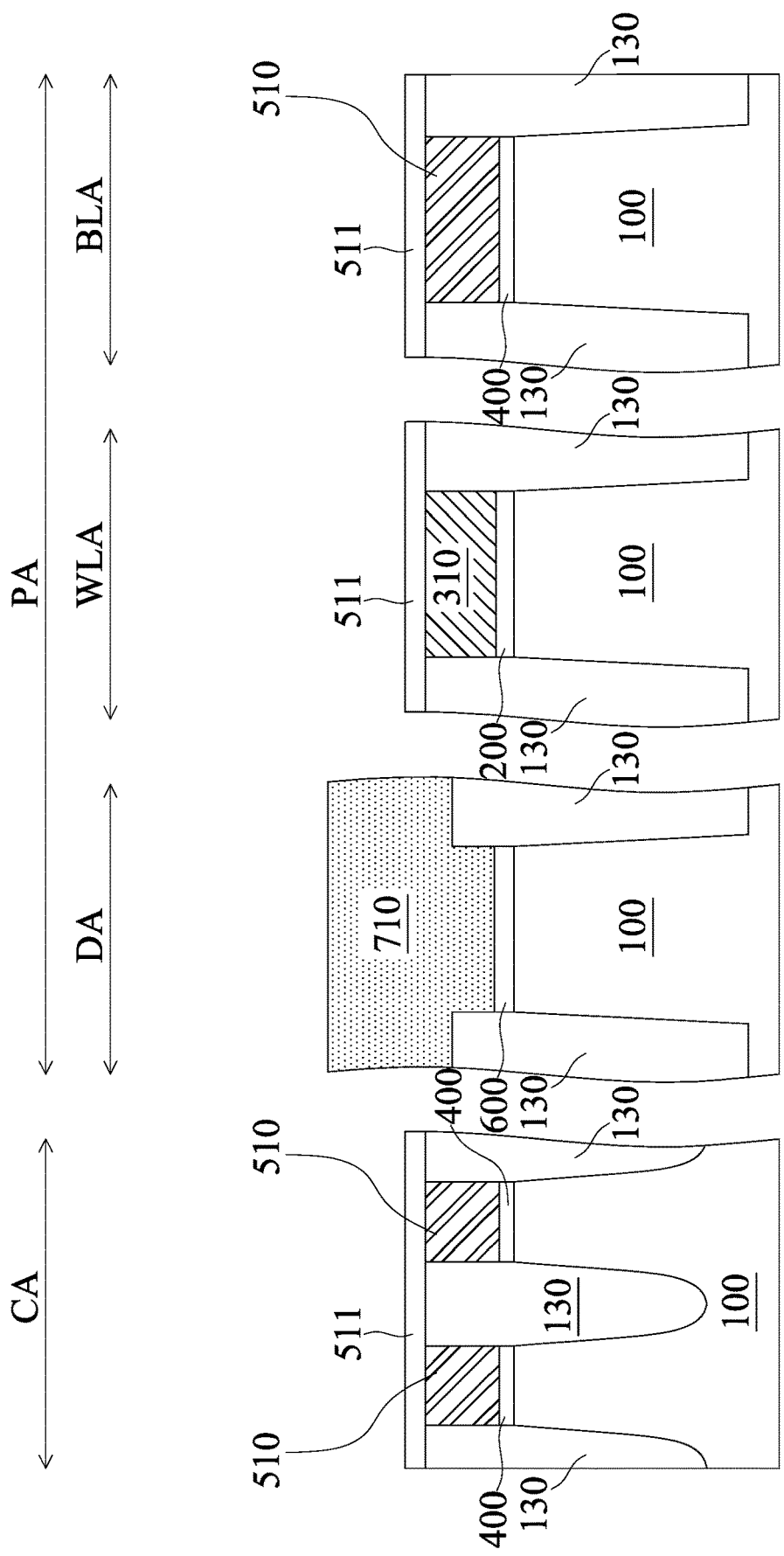

Referring to FIG. 17, a gate dielectric layer 600 is formed on the substrate 100 in the device area DA, and a gate layer 710 is formed on the gate dielectric layer 600 by forming a conductive material, the gate dielectric layer 600 may include oxide, nitride, oxynitride, high dielectric constant (high-k) material, a combination thereof, or any other suitable dielectric materials, but the present disclosure is not limited thereto, the process of forming the gate dielectric layer 600 is similar to the process of forming the floating gate layer 510 described above. In some embodiments, a further process may be performed to make the structure in the device area DA serve as a transistor disposed in the device area DA, the thickness of the gate dielectric layer 600 is determined based on the operation requirements of the subsequently formed transistor, the thickness of the gate dielectric layer 600 may be 12 nm to 20 nm, the thickness of the gate dielectric layer 600 is different from the thickness of the word line dielectric layer 200 and the tunneling dielectric layer 400.

Figure 18:
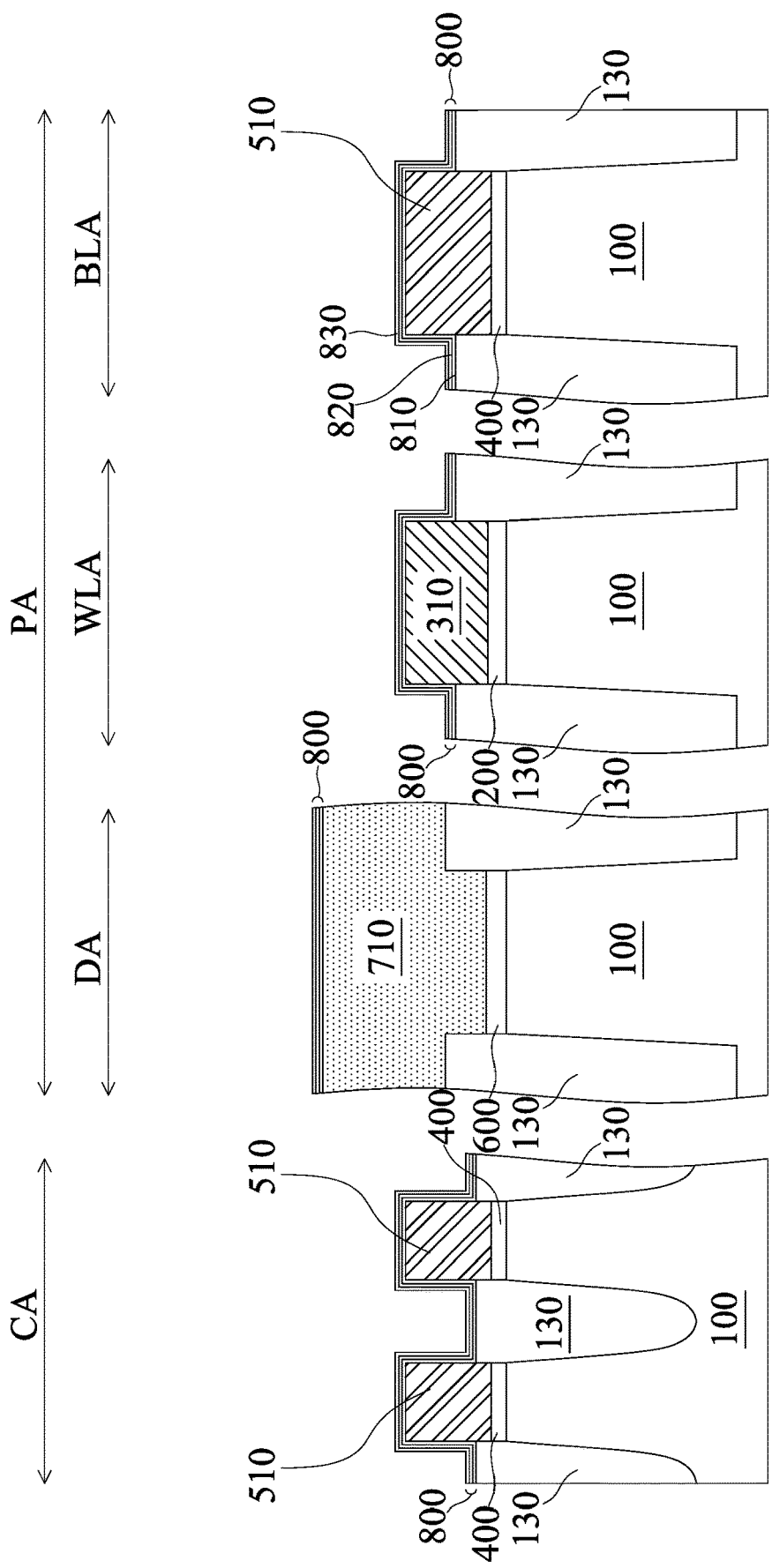

Referring to FIG. 18, the second hard mask 511 is removed, and portions of the isolation structure 130 in the memory cell area CA, the word line area WLA, and the bit line area BLA are removed, the portions of the isolation structure 130 are removed so that the top surface of the isolation structure 130 in the memory cell area CA is between the top surface of the tunneling dielectric layer 400 and the top surface of the floating gate layer 510. The top surface of the isolation structure 130 in the word line area WLA is between the top surface of the word line dielectric layer 200 and the top surface of the first conductive layer 310. Also, the top surface of the isolation structure 130 in the bit line area BLA is between the top surface of the tunneling dielectric layer 400 and the top surface of the floating gate layer 510. Then, a dielectric stack 800 is conformally formed on the substrate 100. Specifically, the dielectric stack 800 is formed on the isolation structure 130 and the floating gate layer 510 in the memory cell area CA. The dielectric stack 800 is formed on the gate layer 710 in the device area DA. The dielectric stack 800 is formed on the isolation structure 130 and the word line dielectric layer 200 in the word line area WLA. The dielectric stack 800 is formed on the isolation structure 130 and the floating gate layer 510 in the bit line area BLA.

The dielectric stack 800 in the memory cell area CA, the word line area WLA, and the bit line area BLA includes a convex structure protruding away from the substrate 100. Therefore, the dielectric stack 800 on the floating gate layer 510 in the memory cell area CA and the bit line area BLA and on the first conductive layer 310 in the word line area WLA is farther away from the substrate 100 than the dielectric stack 800 on the isolation structure 130.

As shown in FIG. 18, the dielectric stack 800 includes a first sub-dielectric layer 810, a second sub-dielectric layer 820, and a third sub-dielectric layer 830, the step of forming the dielectric stack 800 may further include forming a first sub-dielectric layer 810 on the isolation structure 130, the first conductive layer 310, the floating gate layer 510, and the gate layer 710. The second sub-dielectric layer 820 is formed on the first sub-dielectric layer 810. And the third sub-dielectric layer 830 is formed on the second sub-dielectric layer 820, the dielectric stack 800 may include layers of different materials, the dielectric layer stack 800 may include oxide, nitride, oxynitride, a combination thereof, or any other suitable materials, but the present disclosure is not limited thereto, the first sub-dielectric layer 810 and the third sub-dielectric layer 830 include oxide, and the second sub-dielectric layer 820 includes nitride. Therefore, the semiconductor structure of the present disclosure may have oxide-nitride-oxide (ONO) structure.

Figure 19:
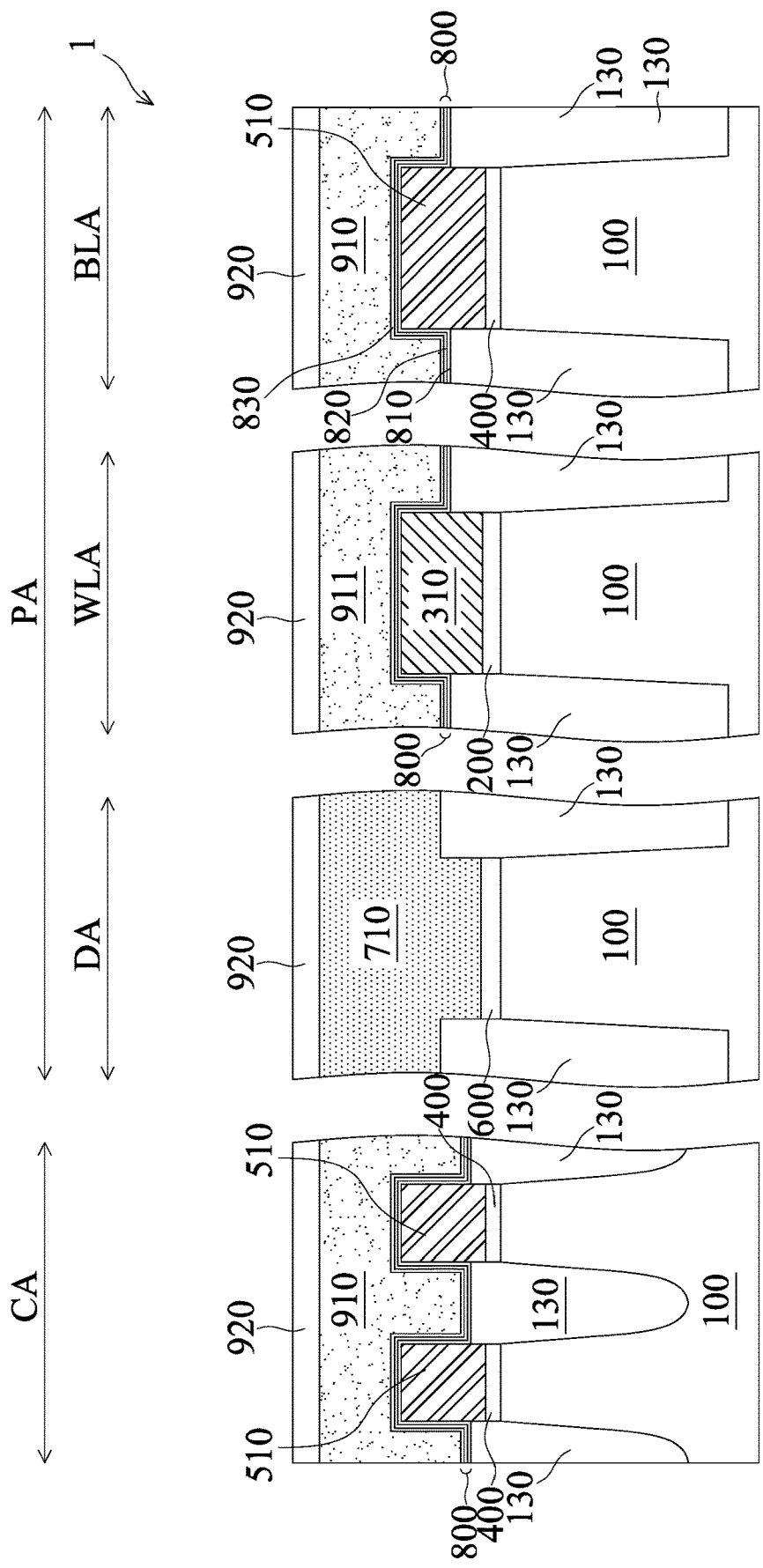

Referring to FIG. 19, the dielectric stack 800 in the device area DA is removed, and a control gate layer 910 is formed on the dielectric stack 800 in the memory cell area CA, the control gate layer 910 may include polysilicon, amorphous silicon, metal, metal nitride, conductive metal oxide, a combination thereof, or other suitable materials.

Forming a second conductive layer 911 on the dielectric stack 800 in the word line area WLA is further included. The material of the control gate layer 910 may be the same as or different from the second conductive layer 911, the step of forming the control gate layer 910 and the step of forming the second conductive layer 911 may be performed in the same process. In other words, the material of the control gate layer 910 may be the same as the material of the second conductive layer 911, a cover layer 920 is further formed on the control gate layer 910 in the memory cell area CA and the bit line area BLA, the gate layer 710 in the device area DA, and the second conductive layer 911 in the word line area WLA, in order to protect all the features disposed under the cover layer 920 and to obtain the semiconductor structure of the present disclosure, the cover layer 920 may include oxide, nitride, oxynitride, a combination thereof, or any other suitable materials.

It should be particularly noted that the first conductive layer 310 and the second conductive layer 911 located in the word line area WLA, and the floating gate layer 510 and the control gate layer 910 located in the bit line area BLA can be used as a wiring of a memory chip to provide electrical connections between features.

In summary, the semiconductor structure of the present disclosure includes a dielectric stack which is an ONO structure. The ONO structure also includes a convex structure protruding away from the substrate, so that the degree of the withstand voltage can be effectively improved. Furthermore, the semiconductor structure of the present disclosure includes dielectric layers disposed in different areas and having a specific thickness relationship with each other, so that the electrical features of different areas can be adjusted.

What is claimed is:

1. A method of forming a semiconductor structure, comprising:
    forming a first sacrificial layer on a substrate, wherein the substrate comprises a memory cell area and a peripheral area, wherein the peripheral area comprises a word line area;
    forming a second sacrificial layer on the first sacrificial layer;
    forming a third sacrificial layer on the second sacrificial layer;
    removing the third sacrificial layer and the second sacrificial layer in the word line area, to expose a top surface of the first sacrificial layer in the word line area;
    removing the first sacrificial layer in the word line area and the third sacrificial layer in the memory cell area;
    forming a word line dielectric layer on the substrate in the word line area;
    forming a first conductive layer on the word line dielectric layer;
    removing the second sacrificial layer in the memory cell area;
    removing the first sacrificial layer in the memory cell area;
    forming a tunneling dielectric layer on the substrate in the memory cell area, wherein a thickness of the tunneling dielectric layer is smaller than a thickness of the word line dielectric layer; and
    forming a floating gate layer on the tunnel dielectric layer.

2. The method as claimed in claim 1, wherein:
    the formation of the tunneling dielectric layer on the substrate in the memory cell area further comprises forming the tunneling dielectric layer on the first conductive layer in the word line area;
    the formation of the floating gate layer on the tunneling dielectric layer further comprises forming the floating gate layer on the tunneling dielectric layer in the word line area; and
    the method further comprises removing the floating gate layer and the tunneling dielectric layer in the word line area, to expose a top surface of the first conductive layer.

3. The method as claimed in claim 1, wherein an isolation structure is formed on the substrate before the third sacrificial layer is formed on the second sacrificial layer, the isolation structure is located in the substrate, the first sacrificial layer and the second sacrificial layer, and the third sacrificial layer is formed on the second sacrificial layer and the isolation structure, wherein the method further comprises:
  removing a portion of the isolation structure;
  forming a dielectric stack on the isolation structure, the first conductive layer and the floating gate layer, so that the dielectric stack on the first conductive layer and the floating gate layer is farther away from the substrate than the dielectric stack on the isolation structure;
  forming a control gate layer on the dielectric stack in the memory cell area; and
  forming a second conductive layer on the dielectric stack in the word line area.

4. The method as claimed in claim 3, wherein:
  the peripheral area further comprises a device area, the device area is located between the word line area and the memory cell area;
  the removal of the second sacrificial layer in the memory cell area further comprises removing the second sacrificial layer in the device area; and
  the formation of the tunneling dielectric layer on the substrate in the memory cell area further comprises forming the tunneling dielectric layer on the first sacrificial layer in the device area.

5. The method as claimed in claim 4, further comprises:
  removing the floating gate layer and a portion of the isolation structure in the device area;
  removing the tunneling dielectric layer and the first sacrificial layer in the device area;
  forming a gate dielectric layer on the substrate in the device area; and
  forming a gate layer on the gate dielectric layer.

6. The method as claimed in claim 5, wherein a thickness of the gate dielectric layer is different from the thickness of the word line dielectric layer and the thickness of the tunneling dielectric layer.

7. The method as claimed in claim 3, wherein the portion of the isolation structure is removed, so that a top surface of the isolation structure in the word line area is between a top surface of the word line dielectric layer and a top surface of the first conductive layer, and a top surface of the isolation structure in the memory cell area is between a top surface of the tunneling dielectric layer and a top surface of the floating gate layer.

8. The method as claimed in claim 3, wherein the dielectric stack is in the memory cell area and the word line area.

9. The method as claimed in claim 3, wherein the dielectric stack comprises a first sub-dielectric layer, a second sub-dielectric layer, and a third sub-dielectric layer, the formation of the dielectric stack on the isolation structure, the first conductive layer and the floating gate layer further comprises:
  forming the first sub-dielectric layer on the isolation structure, the first conductive layer and the floating gate layer;
  forming the second sub-dielectric layer on the first sub-dielectric layer; and
  forming the third sub-dielectric layer on the second sub-dielectric layer.

10. The method as claimed in claim 9, wherein the first sub-dielectric layer and the third sub-dielectric layer comprise oxide, and the second sub-dielectric layer comprises nitride.

11. The method as claimed in claim 1, wherein the first sacrificial layer in the word line area and the third sacrificial layer in the memory cell area are removed in the same process.

12. A semiconductor structure, comprising:
  a substrate comprising a memory cell area and a peripheral area, wherein the peripheral area comprises a word line area;
  a word line dielectric layer disposed on the substrate in the word line area;
  a tunneling dielectric layer disposed on the substrate in the memory cell area, wherein a thickness of the tunneling dielectric layer is smaller than a thickness of the word line dielectric layer;
  an isolation structure disposed on the substrate, wherein a top surface of the isolation structure is higher than top surfaces of the word line dielectric layer and the tunneling dielectric layer;
  a first conductive layer disposed on the word line dielectric layer; and
  a floating gate layer disposed on the tunneling dielectric layer,
  wherein the peripheral area further comprises a bit line area, and the tunneling dielectric layer extends into the bit line area.

13. The semiconductor structure as claimed in claim 12, wherein the top surface of the isolation structure in the word line area is lower than a top surface of the first conductive layer, and the top surface of the isolation structure in the memory cell area is lower than a top surface of the floating gate layer.

14. The semiconductor structure as claimed in claim 12, wherein the peripheral area further comprises a device area, and the semiconductor structure further comprises:
  a gate dielectric layer disposed on the substrate in the device area; and
  a gate layer disposed on the gate dielectric layer.

15. The semiconductor structure as claimed in claim 14, wherein a thickness of the gate dielectric layer is different from the thickness of the word line dielectric layer and the thickness of the tunneling dielectric layer.

16. The semiconductor structure as claimed in claim 12, further comprising:
  a dielectric stack disposed on the isolation structure, the first conductive layer and the floating gate layer, wherein the dielectric stack on the first conductive layer and the floating gate layer is farther away from the substrate than the dielectric stack on the isolation structure;
  a control gate layer disposed on the dielectric stack in the memory cell area; and
  a second conductive layer on the dielectric stack in the word line area.

17. The semiconductor structure as claimed in claim 16, wherein the dielectric stack is in the memory cell area and the word line area.

18. The semiconductor structure as claimed in claim 16, wherein the dielectric stack further comprises:
  a first sub-dielectric layer disposed on the isolation structure, the first conductive layer and the floating gate layer;
  a second sub-dielectric layer disposed on the first sub-dielectric layer; and
  a third sub-dielectric layer disposed on the second sub-dielectric layer.

19. The semiconductor structure as claimed in claim 18, wherein the first sub-dielectric layer and the third sub-dielectric layer comprise oxide, and the second sub-dielectric layer comprises nitride.

* * * * *